(12) United States Patent
Coolbaugh et al.

(10) Patent No.: US 7,714,412 B2
(45) Date of Patent: May 11, 2010

(54) MOS VARACTOR USING ISOLATION WELL

(75) Inventors: Douglas D. Coolbaugh, Essex Junction, VT (US); Douglas B. Hershberger, Essex Junction, VT (US); Robert M. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 145 days.

(21) Appl. No.: 10/711,144

(22) Filed: Aug. 27, 2004

(65) Prior Publication Data
US 2006/0043454 A1    Mar. 2, 2006

(51) Int. Cl.
*H01L 29/93* (2006.01)
(52) U.S. Cl. .............. 257/595; 257/E21.364; 257/E29.344; 438/379
(58) Field of Classification Search ......... 257/312, 257/379, 595, 600, E27.049, E29.344, E21.364, 257/480; 438/379; 332/136
See application file for complete search history.

(56) References Cited

U.S. PATENT DOCUMENTS

| | | | |
|---|---|---|---|
| 5,742,090 A * | 4/1998 | Stolmeijer et al. | 257/510 |
| 6,172,378 B1 * | 1/2001 | Hull et al. | 257/14 |
| 6,407,412 B1 | 6/2002 | Iniewski et al. | |
| 6,521,506 B1 | 2/2003 | Coolbaugh et al. | |
| 6,521,939 B1 | 2/2003 | Yeo et al. | |

(Continued)

FOREIGN PATENT DOCUMENTS

EP      0902483 A1    3/1999

(Continued)

OTHER PUBLICATIONS

Joachim N. Burghartz, et al., "Integrated RF and Microwave Components in BiCMOS Technology", IEEE Transactions On Electron Devices, vol. 43, No. 9, Sep. 1996 (pp. 1559-1570); and.

(Continued)

*Primary Examiner*—Khiem D Nguyen
(74) *Attorney, Agent, or Firm*—Scully, Scott, Murphy & Presser, P.C.; Richard M. Kotulak, Esq.

(57) ABSTRACT

The present invention provides a varactor that has increased tunability and a high quality factor Q as well as a method of fabricating the varactor. The method of the present invention can be integrated into a conventional CMOS processing scheme or into a conventional BiCMOS processing scheme. The method includes providing a structure that includes a semiconductor substrate of a first conductivity type and optionally a subcollector or isolation well (i.e., doped region) of a second conductivity type located below an upper region of the substrate, the first conductivity type is different from said second conductivity type. Next, a plurality of isolation regions are formed in the upper region of the substrate and then a well region is formed in the upper region of the substrate. In some cases, the doped region is formed at this point of the inventive process. The well region includes outer well regions of the second conductivity type and an inner well region of the first conductivity type. Each well of said well region is separated at an upper surface by an isolation region. A field effect transistor having at least a gate conductor of the first conductivity type is then formed above the inner well region.

10 Claims, 3 Drawing Sheets

U.S. PATENT DOCUMENTS

| | | |
|---|---|---|
| 6,542,043 B1 | 4/2003 | Cao |
| 6,566,971 B1 | 5/2003 | Gutierrez |
| 6,608,362 B1 * | 8/2003 | Kai et al. .................... 257/528 |
| 6,670,654 B2 | 12/2003 | Lanzerotti et al. |
| 6,686,640 B2 | 2/2004 | Mheen et al. |
| 6,847,095 B2 * | 1/2005 | Benaissa et al. ............. 257/601 |
| 6,917,095 B1 * | 7/2005 | Wong et al. ................. 257/548 |
| 6,949,440 B2 * | 9/2005 | Gau ........................... 438/379 |
| 7,053,465 B2 * | 5/2006 | Benaissa et al. ............. 257/595 |
| 2002/0074589 A1 | 6/2002 | Benaissa et al. |
| 2003/0122128 A1 * | 7/2003 | Coolbaugh et al. ............ 257/63 |
| 2003/0136992 A1 | 7/2003 | Adan |
| 2004/0114288 A1 * | 6/2004 | Cheng et al. .................. 361/56 |
| 2005/0101098 A1 * | 5/2005 | Gau ........................... 438/379 |

FOREIGN PATENT DOCUMENTS

| | | |
|---|---|---|
| WO | WO 03/043079 A1 | 5/2003 |

OTHER PUBLICATIONS

R.A. Moline, et al., "Ion-Implanted Hyperabrupt Junction Voltage Variable Capacitors", IEEE Transactions On Electron Devices, vol. ED-19, No. 2, Feb. 1972 (pp. 267-273).

* cited by examiner

MOS VARACTOR USING ISOLATION WELL

FIELD OF THE INVENTION

The present invention relates to complementary metal oxide semiconductor (CMOS) and bipolar/CMOS (BiCMOS) electronic devices that include a varactor that has improved tunability which, in some instances, can enable negative biasing and isolation that reduces noise, e.g., parasitics, as well as a process for fabricating such devices. The inventive electronic devices, which include the varactor, are highly suitable for use in mobile or cellular phones, personnel digital assistances (PDAs) and other high RF (radio frequency) electronic devices.

BACKGROUND OF THE INVENTION

Varactors are electronic devices that have a capacitance that is controlled by a suitable voltage or current bias. Varactors are typically employed, for example, in so-called voltage controlled oscillators (VCOs) where a frequency of an oscillator is controlled by an applied current or voltage. In such instances, the VCOs are used when a variable frequency is required, or when a signal needs to be synchronized to a reference signal.

In radio communication devices, such as mobile/cellular phones, VCOs are typically employed in phase locked loop circuits to generate suitable signals including: generation of a reference signal that is synchronized with a signal received by a radio receiver, modulation/demodulation operations and frequency synthesis.

Numerous varactors have been developed and are successfully employed in integrated circuit technologies. For example, it is known to employ pn-diodes, Schottky diodes or MOS-diodes as a varactor in bipolar, CMOS and BiCMOS technologies. In the article to R. A. Moline, et al., entitled "Ion-implanted Hyperabrupt Junction Voltage Variable Capacitors" IEEE Trans. Electron. Device, ED-19, pp267f, 1972, varactors comprising pn-diodes are described. U.S. Pat. No. 3,638,300 to Foxhall, et al.; U.S. Pat. No. 4,226,648 to Goodwin, et al.; U.S. Pat. No. 4,827,319 to Pavlidis, et al; and U.S. Pat. No. 5,557,140 to Nguyen, et al. describe other types of variable capacitor (i.e., varactor) diodes that include hyperabrupt ion-implanted junctions. The term 'hyper-abrupt' denotes that the implant has a doping profile that is in contact with the wall of the adjacent extrinsic base region. U.S. Pat. No. 4,973,922 to Embree, et al.; U.S. Pat. No. 5,965,912 to Stolfa, et al; and U.S. Pat. No. 6,100,770 to Litwin, et al., on the other hand, describe MOS-diodes that are employed as varactors.

The integration of varactors depends on the capability of the integrated circuit technology. An overview of integrated circuit devices for high RF applications in BiCMOS technology is described, for example, in J. N. Burghartz, et al. "Integrated RF and Microwave Components in BiCMOS Technology", IEEE Trans. Electron Devices, Col. 43, pp1559, September 1996. As is stated therein, varactors are not a part of the standard BiCMOS device set. Instead, it is proposed to employ a collector-base junction of a bipolar transistor as a varactor.

In order to use a device as a varactor, the device must satisfy one or more, preferably two or more, of the following criteria: (1) tunability (i.e., ratio of maximum capacitance to minimum capacitance) must be high (on the order of about 3 or greater); (2) Quality factor Q must be high (on the order of about 20 or greater); and (3) the device must exhibit linearity.

Many of the known prior art varactors do not meet the above criteria. For example, traditional base-collector junction varactors rely on the NPN base-collector profile, which is not optimized for varactor tunability. In the case of hyperabrupt base-collector junction varactors, where the doping profile of the implant is located at the "wall" of the extrinsic base region, the device lacks linearity. With traditional MOS varactors, the tunability is high; however, an even higher tunability is often required.

In view of the above-mentioned drawbacks with prior art varactors, there is a continued need for providing new and improved varactors, which satisfy the above criteria and that can be integrated with CMOS and BiCMOS devices.

Moreover, in conventional MOS varactor designs it is difficult to electrically isolate the MOS varactor from the bulk substrate. The lack of sufficient electrical isolation results in a device that has high parasitics, e.g., noise. As such, there is also a need to provide a varactor design that has sufficient electrical isolation thereby reducing noise in the device.

SUMMARY OF THE INVENTION

The present invention provides a varactor that has increased tunability and a high quality factor Q as well as a method of fabricating the varactor. The method of the present invention can be integrated into a conventional CMOS processing scheme or into a conventional BiCMOS processing scheme.

Specifically, and in broad terms, the varactor of the present invention comprises:

a semiconductor substrate of a first conductivity type, said substrate including a doped region of a second conductivity type located below an upper region of said substrate, said first conductivity type is different, in terms of dopant type, from said second conductivity type;

a well region located in said upper region of said substrate, wherein said well region includes outer well regions of said second conductivity type and an inner well region of said first conductivity type, each well of said well region is separated at an upper surface by an isolation region; and a field effect transistor having at least a gate conductor of said first conductivity type located above said inner well region.

In some embodiments in which a BiCMOS or a bipolar transistor is to be fabricated, the doped region of the second conductivity type is a subcollector. In other embodiments in which a CMOS device is to be fabricated, the doped region of the second conductivity type is an isolation well.

In one embodiment of the present invention, which represents a preferred embodiment, the varactor comprises a p-type semiconductor substrate, said p-type substrate including an n-doped region, i.e., subcollector or isolation well, located below an upper region of said substrate;

a well region located in said upper region of said substrate, wherein said well region includes outer N-well regions and an inner P-well region, each well of said well region is separated at an upper surface by an isolation region; and a field effect transistor having at least a p-type gate conductor located above said inner P-well region.

In another embodiment of the present invention, the varactor comprises an n-type semiconductor substrate, said n-type substrate including a p-doped region, i.e., subcollector or isolation well, located below an upper region of said substrate;

a well region located in said upper region of said substrate, wherein said well region includes outer P-well regions and an inner N-well region, each well of said well region is separated at an upper surface by an isolation region; and a field effect transistor having at least an n-type gate conductor located on said inner N-well region.

In addition to the varactor structure, the present invention also provides a method of fabricating the same. The method includes the steps of:

providing a structure that comprises a semiconductor substrate of a first conductivity type;

forming a plurality of isolation regions in said upper region of said substrate;

forming a well region in said upper region of said substrate, wherein said well region includes outer well regions of a second conductivity type that differs from the first conductivity type and an inner well region of said first conductivity type, each well of said well region is separated at an upper surface by an isolation region; and forming a field effect transistor having at least a gate conductor of said first conductivity type above said inner well region.

In one embodiment, the substrate includes a doped region of a second conductivity type located below an upper region of the substrate. The doped region can be formed prior to forming the plurality of isolation regions or after forming the plurality of isolation regions, yet prior to well region formation. It is again noted that the doped region can be a subcollector for a BiCMOS or bipolar device, or an isolation well for a CMOS device.

In the case of a preferred varactor structure, the method includes the steps of:

providing a structure that comprises a p-type semiconductor substrate;

forming a plurality of isolation regions in said upper region of said substrate;

forming a well region in said upper region of said substrate, wherein said well region includes outer well N-regions and an inner P-well region, each well of said well region is separated at an upper surface by an isolation region; and forming a field effect transistor having at least a p-type gate conductor above said inner well region.

In one embodiment, the substrate includes a doped region of a second conductivity type located below an upper region of the substrate. The doped region can be formed prior to forming the plurality of isolation regions or after forming the plurality of isolation regions, yet prior to well region formation

DETAILED DESCRIPTION OF THE INVENTION

Figure 1A:
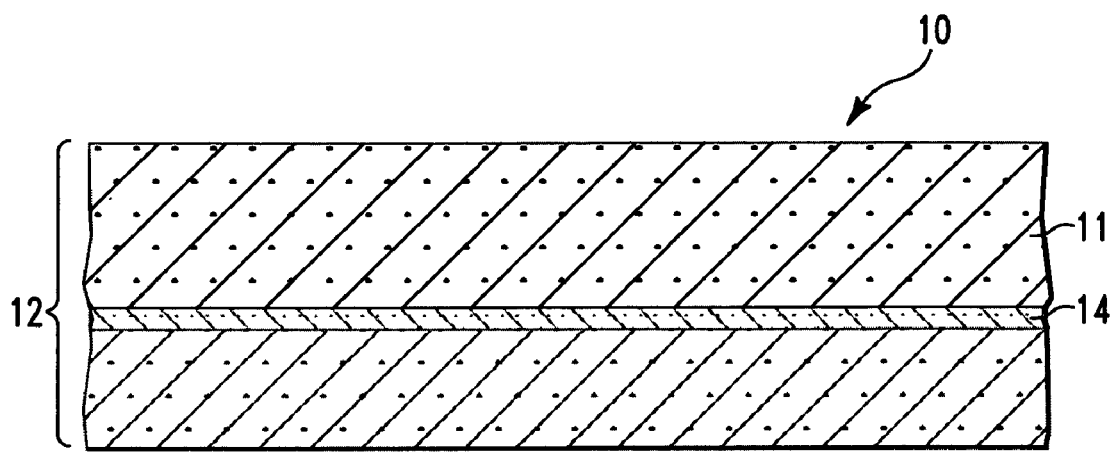
FIGS. 1A-1D are pictorial representations (through cross sectional views) illustrating the basic processing steps employed in the present invention for fabricating an accumulation varactor for BiCMOS or bipolar applications.

The present invention, which provides a MOS varactor having improved tunability and reduced parasitics, i.e., noise, as well as a method of fabricating the same will now be described in greater detail by referring to the drawings that accompany the present application. It is noted that the drawings of the present application are provided for illustrative purposes and are thus not drawn to scale. Moreover, like and corresponding elements shown in the drawings are referred to by like reference numerals.

In the description that follows, a PMOS varactor for BiCMOS and bipolar applications including an alternating N-well, P-well, and N-well layout and a n-type subcollector is described. Although this arrangement is described in detail, the present invention also contemplates a NMOS varactor for BiCMOS or bipolar applications that would include an alternating P-well, N-well, and P-well layout and a p-type subcollector. The NMOS varactor is made by using the opposite dopant conductivity than the PMOS varactor. It is noted that for BiCMOS or bipolar applications such as shown, for example, in FIGS. 1A-1D, the subcollector, which represents a doped region of a second conductivity type that differs from the first conductivity type dopant present in the substrate, is present. In CMOS applications, an isolation well, which represents a doped region of a second conductivity type that differs from the first conductivity type dopant present in the substrate, is present. The dope region can be formed prior to the forming isolation regions or after isolation region formation, but prior to the inventive well region formation.

Reference is first made to FIG. 1A which illustrates an initial structure 10 that is formed after n+ subcollector 14 is formed into a portion of semiconductor substrate 12. The semiconductor substrate 12 comprises a semiconducting material including, for example, Si, SiGe, SiGeC, SiC, GaAs, InAs, InP or layered semiconductors such as, for example, silicon-on-insulators (SOIs), SiGe-on-insulators (SGOIs), and Si/SiGe. For the embodiment illustrated, the semiconductor substrate 12 is a p-type substrate. Note that the substrate 12 includes an upper region 11 that can include the substrate material itself or an optional epitaxial grown semiconductor layer that can be formed thereon prior to forming the n+ subcollector 14.

The n+ subcollector 14 is formed by implanting n-type dopant atoms such as As or P using a conventional ion implantation process and conditions that are well known to those skilled in the art. The implant may be a blanket implant providing a continuous subcollector 14 throughout the entire substrate or a masked ion implantation process can be used to form a discrete subcollector within a specific portion of the substrate. One possible n-type dopant that can be employed is As which can be implanted at a doping dosage from about 1E14 to about 5E16 atoms/cm$^2$ and at an energy from about 20 to about 100 keV. Other dopant ions and/or implant conditions besides those mentioned above can also be employed. The n+ subcollector 14 is located about 300 to about 2000 nm from the upper surface of the substrate 12.

Notwithstanding the type of dopant used, the subcollector 14 typically has a dopant concentration from about 1E18 to about 1E20 atoms/cm$^3$, with a dopant concentration from about 1E19 to about 1E20 atoms/cm$^3$ being more typical.

Note that although the subcollector 14 is shown as being formed at this point of the present invention, the subcollector 14 can be formed latter on during the process, i.e., after isolation region formation, but prior to well region formation.

In some embodiments as mentioned above, an epitaxial semiconductor layer such as silicon or SiGe is formed on the surface of the semiconductor substrate 12 utilizing a conventional epitaxial growth process that is well known to those skilled in the art. This epitaxial layer would correspond to region 11 labeled in FIG. 1A.

Figure 1B:
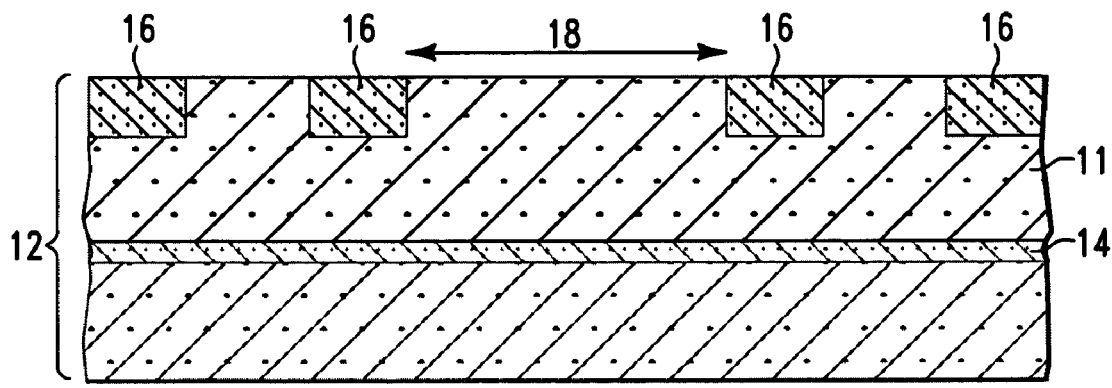

Next, and as shown in FIG. 1B, a plurality of isolation regions 16 are formed into an upper region 11 of semiconductor substrate 12. The plurality of isolation regions 16 formed at this point of the present invention may be local oxidation of silicon (LOCOS) isolation regions, or more preferably, the plurality of isolation regions 16 are trench isolation regions, as shown in FIG. 1B. The isolation regions 16 are formed utilizing processes that are well known to those skilled in the art. For example, and when the isolation regions 16 are comprised of LOCOS isolation regions, a local oxidation of silicon process can be employed in forming such isolation regions. When the isolations regions 16 are comprised of trench isolation regions, the trench isolation regions are formed by lithography, etching and trench fill (i.e., deposition of a trench dielectric such as tetratethylorthosilicate (TEOS) or a high-density plasma oxide (HDPO)). A planarization process such as chemical mechanical polishing (CMP) or grinding may optionally follow the trench fill. Also, an optional densification process can be used.

In the present invention, the plurality of isolation regions 16 are formed in the upper region 11 of the substrate 12 and they do not extend down to the n+ subcollector 14. Two neighboring isolation regions, as shown in FIG. 1B, define device region 18.

Figure 1C:
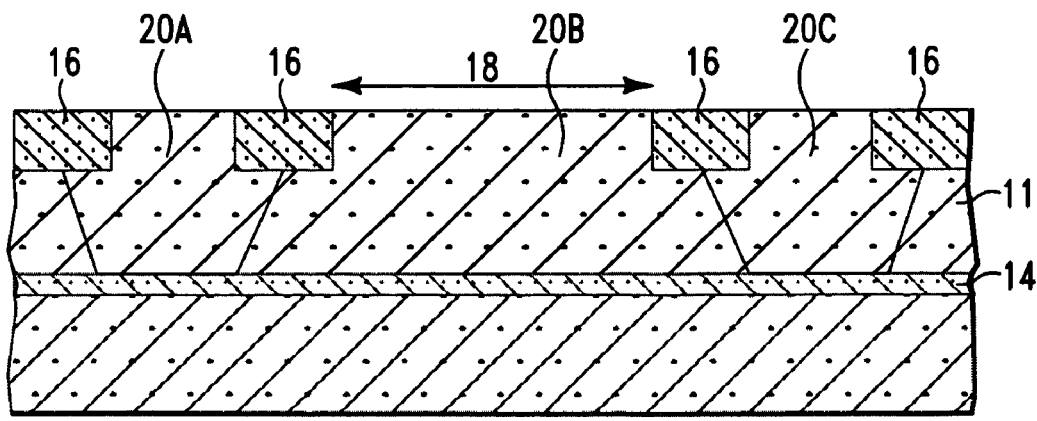

Next, a well region of alternating conductivity is formed via ion implantation and annealing. In the present example depicted in FIG. 1C, the well region of alternating conductivity comprises first N-well region 20A, P-well region 20B, and second N-well region 20C. In another embodiment, the alternative doping configuration is formed for the well region. In the present example depicted in FIG. 1C, the P-well region ("active well") 20B is located in the device region 18. The N-well regions 20A and 20C are formed adjacent to device region 18 and those well regions can be referred to herein as "reach-through implant regions". As shown, the well regions extend beneath the isolation regions 16 such that each neighboring well region is in contact with the adjoining well region, for example, 20A and 20B. The well regions 20A, 20B and 20C extend down to the surface of the n+ subcollector 14, as is depicted in FIG. 1C. The well regions 20A and 20C are used to electrically contact the subcollector 14 or isolation well 14.

As stated above, the well regions are formed by ion implantation and annealing. The type of dopant used in forming each well is dependent on the final polarity of the varactor. N-type dopants such as an element from Group VA of the Periodic Table of Elements like As and P are employed in forming the N-wells, while p-type dopants such as an element from Group IIIA of the Periodic Table of Elements like B, In and Ga are used in forming the P-well.

Notwithstanding the type of dopant used, each well region typically has a dopant concentration from about 1E17 to about 1E19 atoms/cm$^3$, with a dopant concentration from about 1E17 to about 1E18 atoms/cm$^3$ being more typical.

In accordance with the present invention, a selective dopant ion type is implanted into a portion of the semiconductor substrate 12 utilizing a masked ion implantation process. The outer well regions 20A and 20C can be formed at the same time utilizing the same implantation conditions. Alternatively, the outer well regions 20A and 20C can be formed at different times utilizing different implantation conditions. The order of the implantations may vary. For example, well region 20B can be formed before or after well regions 20A and 20C.

The implantation conditions used in forming each well region are conventional and are well known to those skilled in the art. For example, the implant conditions for forming a N-well region can include a n-type dopant dosage from about 1E12 to about 8E15 atoms/cm$^2$ and an energy from about 30 to about 1000 keV. The P-well region can be formed utilizing a p-type dopant dosage from about 1E12 to about 8E13 atoms/cm$^2$ and an energy from about 30 to about 600 keV. If a reach-through (n-type) implant is available in the technology, one would replace this implant for the standard N-well implants. Typically, this reach-through implant includes an n-type dopant such as Sb; dopant dosage is from 5E13 to 5E14 and an energy from 100 to 300 keV.

The ion implantations can be performed using a substantially vertical ion implantation process or alternatively, an angled ion implantation process can be used.

The annealing process is used to activate the dopants within each well region. A single annealing step can be used after the well region is formed, or alternatively, an anneal process can follow the implantation of each individual well region. The annealing temperature used in the present invention is typically from about 900° C. or greater, with an annealing temperature from about 1000° C. or greater being more typical. The annealing times may vary depending on the type of anneal process used. For example, annealing times of about 5 minutes or less are typically used for a rapid thermal anneal (RTA) process, a laser annealing, or a spike anneal, while annealing times of about 30 minutes or greater are typically used for furnace annealing.

It should be noted that the activation of the well regions can be delayed until another thermal cycle within the process of the present invention is performed. For example, the well regions can be activated during source/drain diffusion activation. Delaying the activation of the well regions until a latter thermal process is advantageous since it reduces the number of thermal cycles, and hence cost, within the overall process.

Figure 1D:
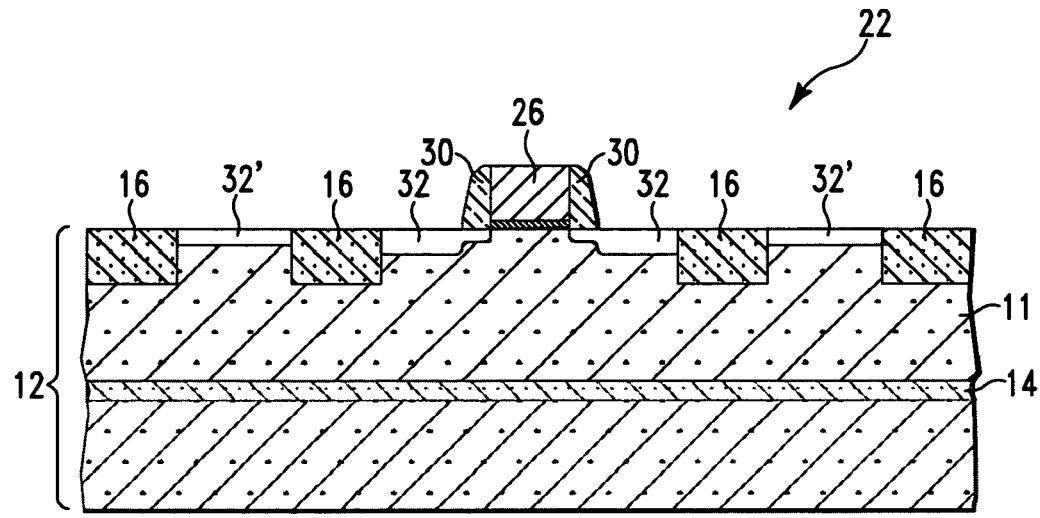

A conventional CMOS process is then employed providing the varactor 22 shown in FIG. 1D. Note that the varactor 22 shown in FIG. 1D comprises a field effect transistor (FET) which includes gate dielectric 24, gate conductor 26, at least one spacer 30 located on sidewalls of at least the gate conductor 26 and source/drain regions 32 located in the upper portion of substrate 10. The varactor 22 is located within the device region 18 atop the middle well region, i.e., P-well region 20B.

One conventional CMOS process that can be used in forming the varactor 22 shown in FIG. 1D includes the following steps: gate dielectric 24 is first formed on the entire surface of the structure shown in FIG. 1C including the semiconductor substrate 12 and atop the isolation regions 16, if they are comprised of a deposited dielectric.

The gate dielectric 24 can be formed by a thermal growing process such as, for example, oxidation, nitridation or oxynitridation. Alternatively, the gate dielectric 24 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric 24 may also be formed utilizing any combination of the above processes.

The gate dielectric 24 is comprised of an insulating material including, but not limited to: an oxide, nitride, oxynitride and/or silicate including metal silicates and nitrided metal silicates. In one embodiment, it is preferred that the gate dielectric 24 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof.

The physical thickness of the gate dielectric 24 may vary, but typically, the gate dielectric 24 has a thickness from about 0.5 to about 10 nm, with a thickness from about 0.5 to about 3 nm being more typical.

After forming the gate dielectric 24, a blanket layer of polysilicon (i.e., polySi) which becomes the gate conductor 26 shown in FIG. 1D is formed on the gate dielectric 24 utilizing a known deposition process such as, for example, physical vapor deposition, CVD or evaporation. The blanket layer of polysilicon may be doped or undoped. If doped, an in-situ doping deposition process may be employed in forming the same. Alternatively, a doped polySi layer can be formed by deposition, ion implantation and annealing. The doping of the polySi layer will shift the workfunction of the gate formed. Illustrative examples of dopant ions include As, P, B, Sb, Bi, In, Al, Ga, Tl or mixtures thereof. In the example shown in the drawings, a p-doped polysilicon gate conductor 26 is formed. Preferable doses for the ion implants are 1E14 ($=1\times10^{14}$) to 1E16 ($=1\times10^{16}$) atoms/cm$^2$ or more preferably 1E15 to 5E15 atoms/cm$^2$. The thickness, i.e., height, of the polysilicon layer deposited at this point of the present invention may vary depending on the deposition process employed. Typically, the polysilicon layer has a vertical thickness from about 20 to about 180 nm, with a thickness from about 40 to about 150 nm being more typical.

Notwithstanding the type of dopant used, the gate conductor 26 typically has a dopant concentration from about 1E19 to about 1E21 atoms/cm$^3$, with a dopant concentration from about 5E19 to about 5E20 atoms/cm$^3$ being more typical.

After deposition of the blanket layer of polysilicon 26, a hard mask 28 is formed atop the blanket layer of polysilicon 26 utilizing a deposition process such as, for example, physical vapor deposition or chemical vapor deposition. The hard mask 28 may be an oxide, nitride, oxynitride or any combination thereof. In one embodiment, a nitride such as, for example, $Si_3N_4$, is employed as the hard mask 28. In yet another embodiment, the hard mask 28 is an oxide such as $SiO_2$. The thickness, i.e., height, of the hard mask 28 is from about 20 to about 180 nm, with a thickness from about 30 to about 140 nm being more typical.

The blanket polysilicon layer 26 and the hard mask 28 are then patterned by lithography and etching so as to provide at least one patterned gate stack. The patterned gate stacks may have the same dimension, i.e., length, or they can have variable dimensions to improve device performance. Each patterned gate stack at this point of the present invention includes the polySi gate conductor 26 and the hard mask 28. The lithography step includes applying a photoresist to the upper surface of the hard mask 28, exposing the photoresist to a desired pattern of radiation and developing the exposed photoresist utilizing a conventional resist developer. The pattern in the photoresist is then transferred to the hard mask 28 and the blanket layer of polysilicon 26 utilizing one or more dry etching steps. In some embodiments, the patterned photoresist may be removed after the pattern has been transferred into the hard mask 28. In other embodiments, the patterned photoresist is removed after etching has been completed.

It is noted that the hardmask 28 is typically removed during or after the gate patterning process. The hardmask 28 is not typically present in the final structure. See FIG. 1D.

Suitable dry etching processes that can be used in the present invention in forming the patterned gate stack include, but are not limited to: reactive ion etching, ion beam etching, plasma etching or laser ablation. The dry etching process employed is typically selective to the underlying gate dielectric 24 therefore this etching step does not typically remove the gate dielectric 24. In some embodiments, this etching step may however be used to remove portions of the gate dielectric 24 that are not protected by the gate stack.

Next, at least one spacer 30 is formed on exposed sidewalls of the patterned gate stack. The at least one spacer 30 is comprised of an insulator such as an oxide, nitride, oxynitride and/or any combination thereof. The at least one spacer is formed by deposition and etching.

The width of the at least one spacer 30 must be sufficiently wide enough such that the source and drain silicide contacts (to be subsequently formed) do not encroach underneath the edges of the gate stack. Typically, the source/drain silicide does not encroach underneath the edges of the gate stack when the at least one spacer 30 has a width, as measured at the bottom, from about 15 to about 80 nm.

After spacer formation, source/drain regions 32, 32' are formed into the substrate 12. The source/drain regions 32, 32' are formed utilizing ion implantation and an annealing step. The annealing step serves to activate the dopants that were implanted by the previous implant step. The conditions for the ion implantation and annealing are well known to those skilled in the art. The term "source/drain regions" includes deep source/drain diffusion regions, optional halo implants and source/drain extension regions.

Next, and if not previously removed, the exposed portion of the gate dielectric 24 is removed utilizing a chemical etching process that selectively removes the gate dielectric 24. This etching step stops on an upper surface of the semiconductor substrate 12 as well as an upper surface of the isolation regions 16. Although any chemical etchant may be used in removing the exposed portions of the gate dielectric 24, in one embodiment dilute hydrofluoric acid (DHF) is used.

The source/drain regions 32, 32' and optionally at least a portion of gate conductor 24 can be silicided at this point of the present invention by utilizing a conventional source/drain silicidation process and metal gate silicidation processes that are well known to those skilled in the art.

It is noted that FIG. 1D shows the structure of the present invention for BiCMOS or bipolar applications, i.e., varactor 22 located atop a substrate 12 that includes a well scheme and an underlying subcollector. In the drawing, the varactor 22 includes a p-type polysilicon gate conductor 26, an underlying P-well region 20B, adjacent N-well regions 20A and 20C that are separated from the varactor by isolation regions 16 and underlying n+ subcollector 14 which isolates the P-well region 20B from the body of the p-type semiconductor substrate 12. The opposite polarity type of structure is also contemplated, i.e., a n-type polysilicon gate conductor 26, an underlying N-well region 20B, adjacent P-well regions 20A and 20C that are separated from the varactor structure by isolation regions 16 and underlying p+ subcollector 14 which isolates the N-well region 28B from the body of the n-type semiconductor substrate 12.

The structure depicted in FIG. 1D is preferred since it provides a negative bias accumulation varactor that operates in depletion.

It is noted that other varactors 22 can be formed on the surface of the substrate 12 as needed.

Figure 2:
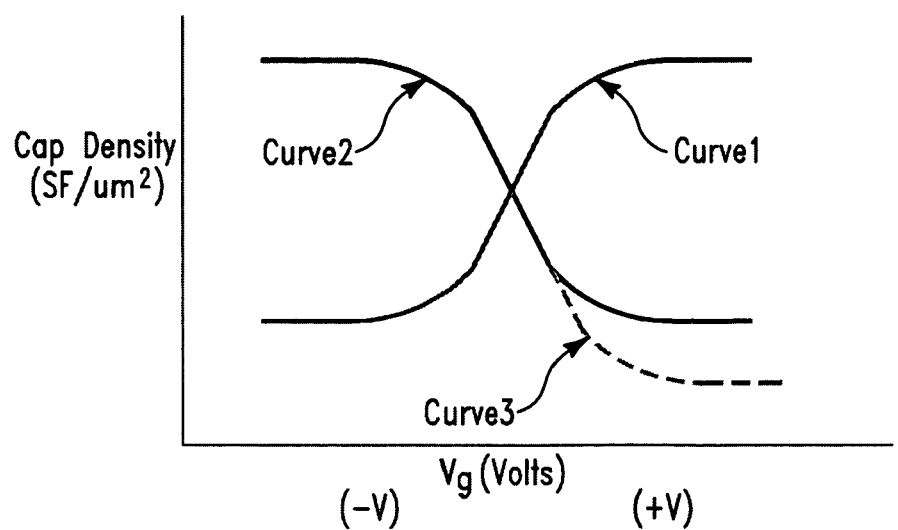
FIG. 2 is a plot of CV characteristics (capacitance density vs. gate voltage Vg) for a prior art NMOS in a n-well (Curve 1), a prior art PMOS in a p-well (Curve 2), and the inventive PMOS accumulation varactor (Curve 3).

FIG. 2 shows the CV characteristics of a prior art NMOS in a N-well (Curve 1), a prior art PMOS in a P-well (Curve 2) and the inventive varactor PMOS in a P-well with a well scheme and an underlying n+ subcollector or isolation well. One observes from this drawing that the minimum capacitance on the inventive varactor decreases and thus increases the tunability of the device in comparison to curves 1 and 2. This decrease in minimum capacitance is an affect of the slight counterdoping of the n-type subcollector or the isolation well. This decreases the inventive p-type dopants in the P-well and therefore reduces the minimum capacitance.

Figure 3A:
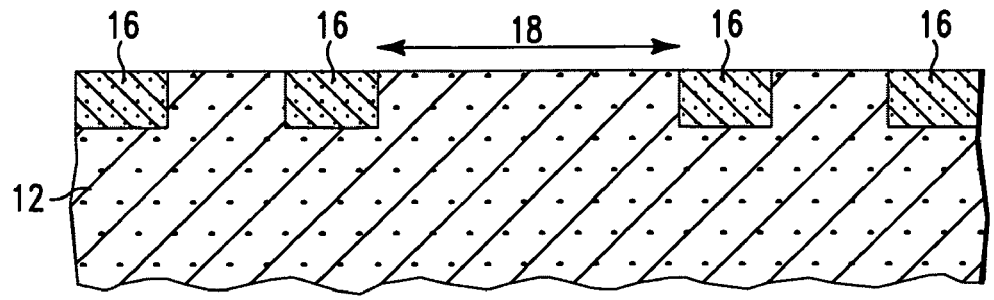
FIGS. 3A-3C are pictorial representations (through cross sectional views) illustrating the basic processing steps employed in the present invention for fabricating an accumulation varactor for CMOS applications.
Figure 3B:
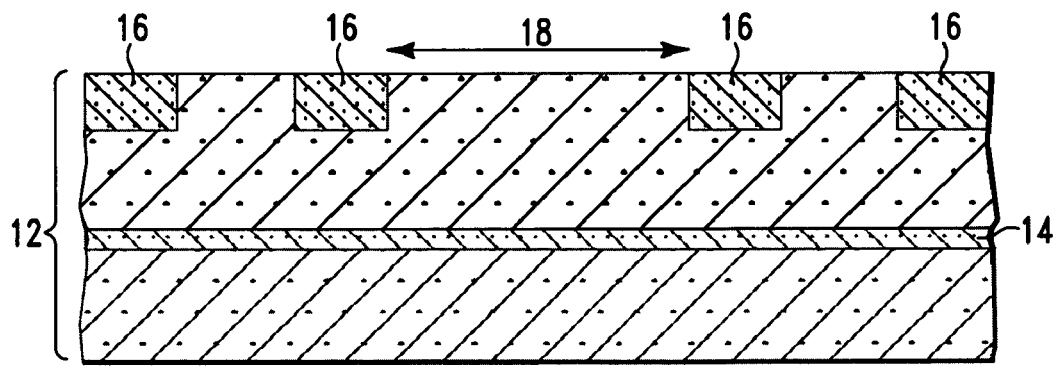
Figure 3C:
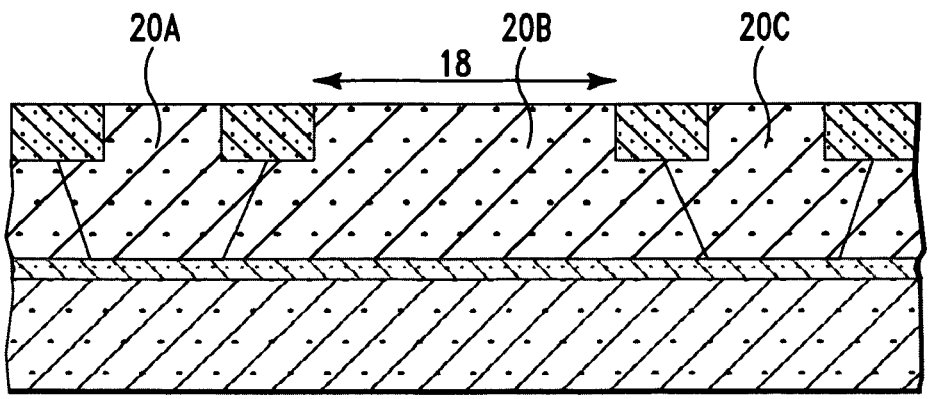

FIGS. 3A-3C illustrate the processing steps used in forming a varactor for CMOS applications. The process begins by first providing the structure shown in FIG. 3A which includes a semiconductor substrate 12 having a plurality of isolation regions 16 formed into an upper region of the substrate 12. The plurality of isolation regions 16 are formed as described above. As shown, device region 18 forms between two neighboring isolation regions. The semiconductor substrate 12 is doped with a first conductivity type dopant (n- or p-type).

Next, isolation well 14 (i.e., dopant region of second conductivity type) is formed by ion implanting a p- or n-type dopant into the structure shown in FIG. 3A producing the structure shown in FIG. 3B. The isolation well region 14 is formed utilizing conventional implantation processes that are well known to those skilled in the art.

Next, well regions 20A, 20B and 20C are formed as described above. Note that 20A and 20C are reach-through implants that have the same conductivity type dopant as the isolation well region 14, while active well region 20B has the same conductivity type dopant as the substrate. The resultant structure is shown in FIG. 3C.

Further processing as described above, can be formed on the structure shown in FIG. 3C so as to provide the structure shown in FIG. 1D.

While the present invention has been particularly shown and described with respect to preferred embodiments thereof, it will be understood by one skilled in the art that the foregoing and other changes in forms and details may be made without departing from the spirit and scope of the invention. It is therefore intended that the present invention is not limited to the exact forms and details described and illustrated, but falls within the spirit and scope of the appended claims.

What is claimed is:

1. A varactor structure comprising:
a semiconductor substrate including a subcollector of a second conductivity type located below an upper region of said semiconductor substrate and a semiconductor layer of a first conductivity type beneath the subcollector, said first conductivity type is different from said second conductivity;
a well region located in said upper region of said semiconductor substrate, wherein said well region includes outer well regions of said second conductivity type and an inner well region of said first conductivity type, each well of alternating conductivity type of said well region is separated at an upper surface by an isolation region, wherein the outer well region and the inner well region each have an upper surface that includes source and drain dopant regions, wherein the source and drain dopant regions of the inner well regions are separated from the source and drain dopant regions of the outer well regions by the isolation region comprising a dielectric material; and
a field effect transistor having at least a gate conductor of said first conductivity type located above said inner well region, the outer well regions and the inner well region are in contact with the subcollector having the second conductivity type, wherein said each well of alternating conductivity type of said well region extends beneath the isolation region to the subcollector such that neighboring well regions are in contact with each other along an entire depth of each well region, wherein the subcollector continuously extends through the outer well region and the inner well region of the semiconductor substrate.

2. The varactor structure of claim 1 wherein said first conductivity type comprises a p-type dopant and second conductivity type comprises a n-type dopant.

3. The varactor structure of claim 1 wherein said first conductivity type comprises a n-type dopant and said second conductivity type comprises a p-type dopant.

4. The varactor structure of claim 1 wherein said upper region of said semiconductor substrate comprises an epitaxial semiconductor layer.

5. The varactor structure of claim 1 wherein said field effect transistor further comprises a gate dielectric located beneath said gate conductor, a hard mask located on said gate conductor, at least one spacer located on sidewalls of said gate conductor and abutting source/drain regions.

6. The varactor structure of claim 1 wherein said gate conductor comprises polysilicon.

7. A varactor structure comprising:
a p-type semiconductor substrate including an n-type subcollector located below an upper region of said semiconductor substrate and a p-type semiconductor layer beneath the n-type subcollector;
a well region located in said upper region of said semiconductor substrate, wherein said well region includes outer N-well regions and an inner P-well region, each well of alternating conductivity type of said well region is separated at an upper surface by an isolation region wherein the outer N-well region and the inner P-well region each have an upper surface that includes source and drain dopant regions, wherein the source and drain dopant regions of the inner P-well regions are separated from the source and drain regions of the outer N-well regions by the isolation region comprising a dielectric material; and
a field effect transistor having at least a p-type gate conductor located above said inner P-well region, the outer N-well regions and the inner P-well region are in contact with the n-type subcollector, wherein the outer N-well regions and the inner P-well region extend beneath the isolation region to the n-type subcollector such that neighboring well regions are in contact with each other along an entire depth of each well region, wherein the n-type subcollector continuously extends through the outer N-well regions and the inner P-well region.

8. The varactor structure of claim 7 wherein said upper region of said semiconductor substrate comprises an epitaxial semiconductor layer.

9. The varactor structure of claim 7 wherein said field effect transistor further comprises a gate dielectric located beneath said gate conductor, a hard mask located on said gate conductor, at least one spacer located on sidewalls of said gate conductor and abutting source/drain regions.

10. The varactor structure of claim 7 wherein said gate conductor comprises polysilicon.

* * * * *